Figure 1:
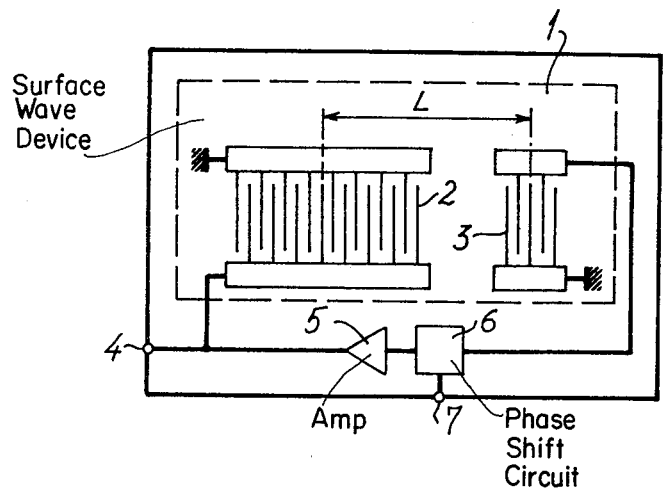

United States Patent [19]

Brossard et al.

[11] 4,271,504
[45] Jun. 2, 1981

[54] FREQUENCY MODULATORS FOR USE IN MICROWAVE LINKS

[76] Inventors: Pierre C. Brossard, 9, Rue des Fleurs, Montigny-le-Bretonneux, France, 78190; Jeannine L. G. Henaff, 3 Ter, Place Marquis, Clamart, France, 92140

[21] Appl. No.: 961,482

[22] Filed: Nov. 17, 1978

Related U.S. Application Data

[63] Continuation of Ser. No. 837,527, Sep. 29, 1977, abandoned.

[30] Foreign Application Priority Data

Oct. 7, 1976 [FR] France ............................... 76 30685

[51] Int. Cl.$^3$ ........................... H04J 1/04; H04J 1/08; H04J 1/14
[52] U.S. Cl. ........................ 370/76; 331/107 A; 332/21; 332/22; 332/26; 370/75; 455/22; 455/42
[58] Field of Search ............... 332/16 R, 21, 22, 23 R, 332/24, 26, 30 V; 331/107 A; 325/7, 9, 11, 45, 47; 179/15 BM; 370/75, 76; 455/7, 17, 20, 22, 23, 42

[56] References Cited

U.S. PATENT DOCUMENTS

| 3,249,897 | 5/1966 | Trilling ............................. 332/24 X |
| 3,855,548 | 12/1974 | Nandi et al. ..................... 331/107 A |
| 3,936,765 | 2/1976 | Lewis et al. .................. 331/107 A X |

FOREIGN PATENT DOCUMENTS

| 2453153 | 5/1975 | Fed. Rep. of Germany . |
| 2224825 | 10/1974 | France . |
| 623741 | 5/1949 | United Kingdom ...................... 332/22 |

OTHER PUBLICATIONS

Marazzi et al., "Thin Film Injection-Locked Oscillators as Amplifying Stages in 2-GHz Radio Repeaters," IEEE International Solid-State Circuits Conference, vol. 14, Feb. 1971, pp. 26-27.
Otala, "Distortion and its Compensation in a Varactor-Controlled Frequency Modulator," Proceedings I.E.E., vol. 117, No. 2, Feb. 1970, pp. 338-342.

Primary Examiner—Siegfried H. Grimm
Attorney, Agent, or Firm—Laff, Whitesel & Rockman

[57] ABSTRACT

Frequency modulators for use in microwave link transmission systems include acoustic surface wave (ASW) oscillators. Each frequency modulator comprises two voltage control quadripole ASW oscillators. Control inputs of the two ASW oscillators receive modulation signal in opposite phase. Outputs of ASW oscillators are mixed in a mixer for delivering an IF signal. Thus frequency deviation is larger than in a conventional arrangement. Moreover, surface wave oscillators make it possible to directly insert a service channel signal in a microwave link repeater, without demodulation and modulation operations.

8 Claims, 5 Drawing Figures

FREQUENCY MODULATORS FOR USE IN MICROWAVE LINKS

This is a continuation of application Ser. No. 837,527, filed Sept. 29, 1977, and now abandoned in favor of this application.

The present invention relates to frequency modulators for use in microwave link transmission system. More particularly, it relates to such frequency modulators including acoustic surface wave oscillators, as well as the transmission systems wherein used are such modulators.

Acoustic surface wave oscillators or ASW oscillators (i.e. oscillators wherein ASW devices are used) have already been described in the technical literature. Thus, in this respect, reference may be made to an article entitled "Surface Wave Grating Reflectors and Resonators" by E. A. Ash, published in the review "IEEE Symposium on Microwave theory and Techniques", Newport Beach, Calif. U.S.A. (1970). Also reference may be made to the article entitled "UHF Surface Acoustic Wave Resonators" by E. J. Staples, published in the "Proc. 28th Symposium on Frequency Control". Atlantic City, N.J., U.S.A., page 280, (1974).

Transmitters are used in microwave link transmission systems for transmitting in frequency modulation, frequency-division, telephone multiplex signals. Before applying the telephone multiplex signals to a frequency mixer circuit for delivering the signal to be radiated by the antenna, the telephone multiplex is applied to a frequency modulator circuit that delivers the modulated signal at the intermediate frequency. The intermediate frequency is usually of 70 MHz (or of 140 MHz for a 2,700-channel telephone multiplex). In prior art systems, a frequency modulator may be a phase modulator for phase modulating a signal delivered from a crystal oscillator. In such a case, the modulation index m is relatively low and constant which results in low frequency deviation $\Delta F$ for low frequencies of the modulating signal, since $m = \Delta F/\text{modulation frequency}$. Still in some prior art systems, a frequency modulator may be a conventional voltage controlled oscillator. In that case, middle frequency stability is not sufficient, without using sophisticated circuits for automatically controlling the modulator middle frequency.

A purpose of the present invention is to provide a frequency modulator without the drawbacks of the already known modulators, i.e. permitting a large frequency deviation while maintaining a stable middle frequency, without a need for sophisticated expensive circuits.

Another purpose of this invention is to provide a frequency modulator including a voltage controlled acoustic surface wave oscillator.

According to a feature of this invention, there is provided a frequency modulator including two acoustic surface wave oscillators. The center frequencies of these oscillators are separated by the value of the intermediate frequency. The said oscillators are controlled by a voltage fed through voltage control inputs as the modulating signal in opposed phases, both the oscillator outputs being mixed in a mixer from which output signal is applied to a band-pass filter centered at the intermediate frequency. The band-pass filter delivers the frequency-modulated IF signal.

According to another feature, there is provided a microwave link transmission system comprising a frequency modulator of the above mentioned type.

Furthermore, in microwave link transmission systems transmitting in frequency modulation, frequency-division telephone multiplex service channels must be added outside of the band allotted to the telephone multiplex. Under limit of the allotted band is, in accordance with CCIR recommendation No. 380-1, 12 kHz in systems transmitting 24-120 telephone channels, 60 kHz in systems transmitting 6011260 Telephone channels, and 300 kHz in systems transmitting 1800-2700 telephone channels. In prior art systems, service channels are added to a telephone multiplex before the completed signals are applied to the main frequency modulator. Therefore, in this modulator, video frequency amplifiers must extend a large frequency ratio. For instance, in a 600-channel telephone multiplex without a service channel, modulator amplifiers must transmit frequencies from 60 kHz to 2792 kHz, which corresponds to a frequency ratio of 46.5. When a service channel is included they must transmit frequencies from 300 Hz to 2792 kHz that results in a substantially higher frequency ratio above 9000. Such modulator amplifiers are complex, to the extent they are realizable, and unavoidably expensive.

In addition, in microwave link relays, no frequency modulator is provided since those relays operate as simple repeaters. Thus, presently there is no possibility of injecting service channels for remote control purposes.

Another purpose of this invention is to provide a circuit that is usable in a microwave link system in either the transmission station or a relay station. This circuit makes it possible to easily insert service channels and avoid complex expensive amplifiers.

According to another feature of this invention, there is provided a microwave link transmission system wherein signals are delivered either from the transmitter local oscillator in the transmission station or from a relay which is directly frequency modulated by service channel information, in an above mentioned frequency modulator. The frequency modulator output signal is applied to the mixer that also receives the conventional IF signal.

Figure 2:
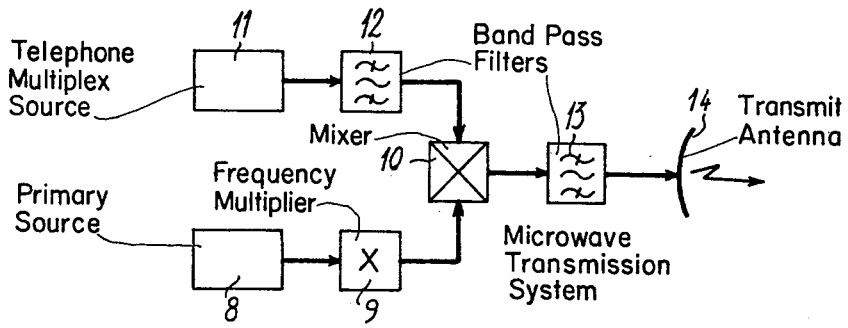
Figure 3:
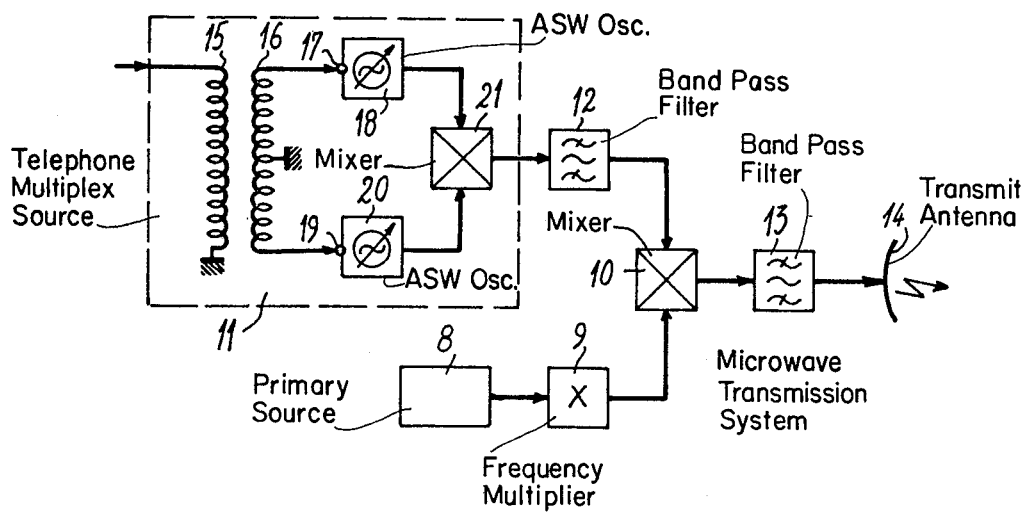
Figure 4:
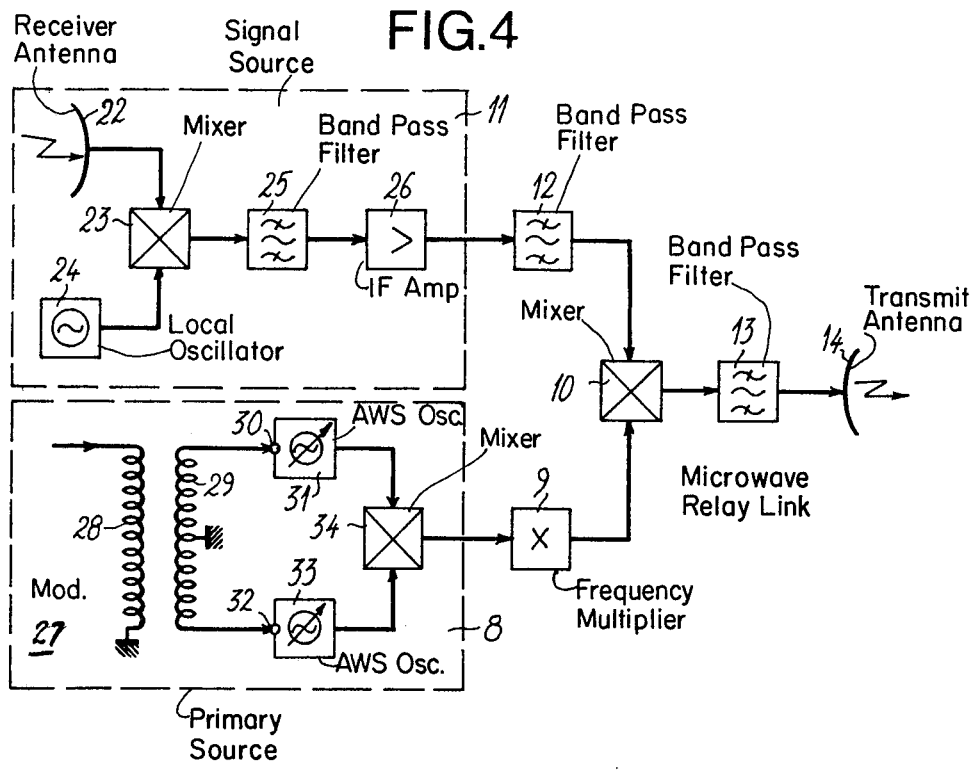
Figure 5:
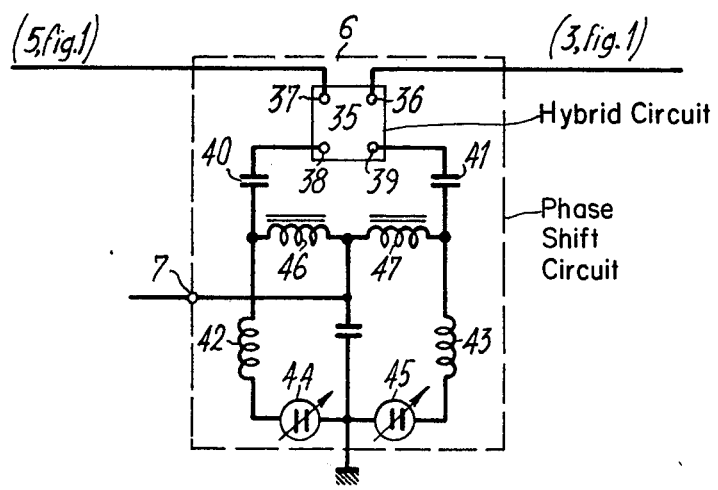

The above mentioned features of the present invention, as well as other features, will appear more clearly from the following description of embodiments, the description being made in conjunction with the accompanying drawings, wherein:

FIG. 1 is a schematic diagram of an acoustic surface wave, quadripole-type oscillator whose frequency is controlled by a DC voltage, FIG. 2 is a block-diagram of a transmission station transmitter or a relay transmitter in a microwave link transmission system, FIG. 3 is the schematic diagram of a frequency modulator according to this invention, utilized for delivering an IF signal modulated by a telephone multiplex, FIG. 4 is the schematic diagram of a transmitter including circuits for inserting service channels, and FIG. 5 is a circuit diagram of a variable delay circuit usable in the oscillator shown in FIG. 1.

As shown in FIG. 1, a delay-line oscillator includes an ASW device 1 on which acoustic surface waves are launched from a transmitter interdigital transducer 2 toward a receiver interdigital transducer 3. One electrode of transducer 2 is grounded while the other is connected to oscillator output 4, on the one hand, and to output of an amplifier 5, on the other hand. One electrode of transducer 3 is grounded while the other is connected to input of amplifier 5, via a controllable varying short-delay or phase shift circuit 6, to which a control voltage is applied via control input 7. Phase shift circuit 6 may be of the same type as that described in an article entitled "Surface acoustic wave devices and applications, 6. Oscillators: the next successful surface acoustic device?" by M. F. Lewis, published in the review "Ultrasonics" of May 1974, pages 115-123.

In the oscillator shown in FIG. 1, transducers 2 and 3 are shaped as interdigital combs whose period $\lambda$ is related to the mean oscillator operation frequency Fo by the relation $\lambda = v/Fo$, wherein v is the acoustic wave speed on the piezoelectric crystal 1. The principles of operation are as follows. Acoustic waves are propagated at speed v. The delay line length L is the distance between the respective centers of transducers 2 and 3. Open-loop phase shift is for a wave angular frequency $\omega$:

$$\phi = (wL)/v + \phi_{add}$$

wherein $\phi_{add}$ is the phase shift added by transducers 2 and 3, plus the associated electronic circuitry of the oscillator. The condition $\phi = 2k\pi$ indicates that the oscillator may have multimode operation. Preferably as shown in FIG. 1, to have a monomode operation, the length of transducer 2 is selected equal to length L or close thereto.

The associated electronic circuitry contributing to the additional phase shift $\phi_{add}$ includes amplifier 5 and circuit 6, which must obviously be considered. The phase shift caused by circuit 6 depends on the voltage applied to terminal 7. By way of example, with a frequency close to 1 GHz, the wave length $\lambda$ is 3.2 $\mu$m for ST-cut quartz, the distance L may be of 200 $\lambda$ and the numbers of the digits in transducers 2 and 3 may respectively be 401 and 201.

In FIG. 2, a microwave link transmission system station transmitter comprises a primary source 8 connected to a frequency multiplier-by-n 9 delivering, for instance, a signal at frequency of 4 GHz. Signals delivered from multiplier 9 are applied to one input of a conventional mixer 10. On the other hand, there is provided a telephone multiplex source 11 for delivering a signal having a mean intermediate frequency of 70 MHz. That frequency is filtered through a band-pass filter 12. Signals delivered from filter 12 are applied to the second input of mixer 10 from which the output signals are applied to antenna 14 through a band-pass filter 13. The configuration of the transmitter shown in FIG. 2 is conventional and operation thereof is well known.

In FIG. 3, a transmitter of the type of that shown in FIG. 2 is also shown, but telephone multiplex source 11 comprises a modulator, according to this invention. The frequency modulator comprises a transformer whose primary winding 15 has one terminal grounded. The other terminal is supplied with the telephone multiplex. The secondary winding 16 has its middle point grounded. One terminal is connected to control terminal 17 of an oscillator 18, and the other terminal is connected to control terminal 19 of an oscillator 20. Both oscillators 18 and 20 are acoustic surface wave oscillators of the type shown in FIG. 1. The frequencies of oscillators 18 and 20 may respectively be controlled via control terminals 17 and 19, thereof, which correspond to terminal 7 in the oscillator shown in FIG. 1. Output signals from oscillators 18 and 20 are respectively applied to the first input and the second input of a mixer 21, that delivers IF signals to filter 12.

By way of example center frequencies of oscillators 18 and 20 respectively are of 1 GHz, and 0.93 GHz which results in a frequency difference therebetween of 70 MHz, i.e. the intermediate frequency. Other center frequencies may be selected provided that there is, between them, a frequency difference corresponding to the intermediate frequency. Transformer 15-16 applies to inputs 17 and 19 signals having opposite phases and containing the frequency-division telephone multiplex. As a result of a subtraction of signals respectively delivered from oscillators 18 and 20, which is implemented in mixer 21, the intermediate frequency signal, is provided here at 70 MHz. A resulting frequency deviation is twice the frequency deviation in each of the oscillators.

Practically a controllable frequency ASW oscillator may be tuned within a frequency relative range of about $2 \times 10^{-3}$. With oscillators having a center frequency of about 1 GHz, a frequency deviation of about $\pm 2$ MHz may then be expected. With the arrangement shown in FIG. 3, a frequency deviation of $\pm 4$ MHz is possible. It is possible to ascertain that the thus obtained frequency band of 8 MHz is suitable for modulation in transmitting a telephone multiplex including 300 telephone channels.

It is still to be noted that a use of relatively high center frequencies in ASW oscillators 18 and 20 makes it possible to operate mixer 21 as a frequency substractor, which improves the frequency-amplitude linear response of the modulator because both oscillators have their own frequencies deviated in opposite directions, which balances out non-linearities of the same type.

Thus, thanks to their relatively high operation frequency and their relatively broadband tune frequency range, voltage control ASW ocillators make it possible to design IF modulators with broad frequency deviation while keeping a stable center frequency which is inherent to that type of oscillators. Finally, since the mixer operates as a subtractor, the band pass filter 12 may be simplified.

Still, in FIG. 4, is shown a transmitter of the same type as that shown in FIG. 2, but it is fitted so that it makes it possible to insert service channels into the links, particularly in microwave link relays. In FIG. 4, source 11 includes a reception antenna 22 supplying a mixer 23 that conventionally achieves frequency mixing together with a local oscillator 24. An IF signal is delivered through a band-pass filter 25 to an IF amplifier 26. The output of amplifier 26 is connected to the input of band-pass filter 12. All of these circuits are conventional in microwave link relays.

Moreover, source 8 comprises a frequency modulator 27, similar to the modulator shown in FIG. 3, comprising components 28-34 respectively corresponding to components 15-21, FIG. 3. The output of mixer 34 is connected to an input of frequency multiplier 9.

Oscillators 31 and 33 have their center frequencies separated by the value of the standard primary source frequency, before being frequency multiplied at 9. Thus, the difference may be of 250 MHz. It is to be noted that such a direct modulation of the primary source by a service channel signal is efficient only when ASW oscillators are used. Indeed if, as in prior art systems, the local oscillator is controlled and stabilized by a quartz crystal, the frequency band usable for modulation by a service channel would be limited to some $10^{-5}$ of the oscillator frequency, i.e. about 100 kHz with a local oscillator operating at 4 GHz. In contrast by utilizing ASW oscillators, the useful frequency band extends up to $\pm 10^{-4}$ which results in a frequency band of 1 MHz.

It is to be noted that, in mixer 10 of the microwave link relay shown in FIG. 4, a frequency modulated IF signal from band pass filter 12 is mixed with another frequency modulated signal having a frequency as high as the local oscillator frequency, which is received from frequency multiplier 9. Such a mixing is possible because, with frequency modulation, the frequency spectrum of the wave is produced by making either the difference or the sum (as usual in frequency mixing) of two frequency modulated waves the convolution product of the spectra of the two initial waves. Thus, as far as the final spectrum is concerned, it is the same either to add service channels to the multiplex signal before performing the frequency modulation, or, as shown in FIG. 4, to mix in frequency the two separately frequency modulated waves.

By way of an example, FIG. 5 shows the configuration of a phase shift circuit 6 which is usable in the ASW oscillator shown in FIG. 1. Circuit 6 comprises a hybrid junction device 35. For instance, such a device is commercialized under the technical reference JH 20 ANZAC. The input terminal 36 is connected from the second electrode of transducer 3 and output terminal 37 is connected to signal input of amplifier 5. Terminals 38 and 39 of hybrid circuit 35 are respectively connected to ground through symmetric paths comprising capacitors 40 and 41, and self-inductances 42 and 43, and varactors 44 and 45. Between the junction point common to capacitor 40 and inductor 42, and junction point common to capacitor 41 and inductor 43, are serially mounted two choke coils 46 and 47. The junction point between choke coils 46 and 47, on the one hand, is discoupled from ground by a suitable capacitor and, on the other hand, connected to input 7 which receives the control voltage. The capacitances of varactors 44 and 45 vary according to the value of the DC voltage applied to input terminal 7 and therefore vary the values of capacitances between 38, 39 and ground—which varies the phase of the signals applied between terminals 36 and 37. Self-inductances 42 and 43 are provided for respectively matching varicaps 44 and 45.

While the principles of the present invention have hereabove been described in relation with specific embodiments, it must be clearly understood that the description has only been made by way of example and does not limit the scope of this invention.

What is claimed is:

1. A frequency modulator comprising two separate oscillator means having center frequencies separated by a predetermined frequency value, means for controlling each of said oscillator means responsive to a modulating signal applied individually to an input terminal on each of said two oscillator means in opposite phases respectively, first means for mixing output signals from said two oscillator means for delivering a frequency modulated signal centered around a frequency corresponding to said predetermined frequency value, each of said oscillator means including a quadripole ASW (acoustic surface wave) oscillator having a feedback branch extending from an output transducer to an input transducer, said feedback branch including a conventional amplifier means and a voltage controlled variable phase shifter, two input terminals on each of said voltage controlled variable phase shifters, one of said input terminals being connected to receive said modulating signal and the other of said input terminals being connected to receive said feedback from said output transducer of said ASW oscillator, and second means for mixing the output of said first mixing means with a source of signals in a microwave telephone transmission system.

2. A frequency modulator according to claim 1, wherein said modulating signal input is applied to one terminal of a primary winding of a transformer, the other terminal of said primary winding being grounded, said control input terminals of said voltage controlled variable phase shifters in said two oscillator means being respectively connected to end terminals of a secondary winding of said transformer, and a middle point of said secondary winding being grounded.

3. A microwave transmission system including means comprising microwave links for transmitting and receiving frequency-division communication signals transmitted through said transmission system, two oscillator means having center frequencies separated by a predetermined frequency value, means for controlling said oscillator means responsive to a modulating signal applied individually to each of said two oscillator means in opposite phases respectively, first means for mixing output signals of said oscillator means for delivering a frequency modulated signal centered around a frequency corresponding to said predetermined frequency value, each of said oscillator means including a quadripole ASW (acoustic surface wave) oscillator having a feedback branch extending from an output transducer to an input transducer, said feedback branch including a conventional amplifier means and a voltage controlled variable phase shifter, two input terminals on each of said voltage controlled variable phase shifters, one of said input terminals being connected to receive said modulating signal and the other of said input terminals being connected to receive a feedback from said output transducer of said ASW oscillator, said modulating signal being a service channel signal outside of the frequency-division communication signals transmitted over said microwave links, said frequency corresponding to said predetermined value being the frequency of a local oscillator in a primary source of the system, and second mixer means for combining the output of said first mixing means and said communication signals.

4. A transmission system including two oscillator means having center frequencies separated by a predetermined frequency value, means for driving said oscillator means responsive to a modulating signal applied individually to each of said two oscillator means in opposite phases respectively, means for mixing output signals of said oscillator means for delivering a frequency modulated signal centered around a frequency corresponding to said predetermined frequency value, each of said oscillator means including a quadripole ASW (acoustic surface wave) oscillator having a feedback branch extending from an output transducer to an input transducer, said feedback branch including a conventional amplifier means and a voltage controlled variable phase shifter, two input terminals on each of said voltage controlled variable phase shifters, one of said input terminals being connected to receive said modulating signal and the other of said input terminals being connected to receive a feedback from said output transducer of said ASW oscillator, means for applying said modulating signal to one terminal of a primary winding of a transformer, the other terminal of said primary winding being grounded, said driving means being end terminals of a secondary winding of said transformer connected to said input terminals of said voltage controlled variable phase shifters in said two oscillator means, a middle point of said secondary winding being grounded, separate means including microwave links having a frequency-division telephone multiplex source for transmitting microwave signals throughout said system, said modulating signal being service channel signals outside of said frequency-division telephone multiplex frequency band transmitted over said microwave links, said predetermined frequency corresponding to the frequency of a local oscillator associated with said service channel, and second means for mixing said frequency-division multiplex with said modulated service channel signals.

5. A microwave frequency-division telephone multiplex transmission system including two oscillator means having center frequencies separated by a predetermined frequency value, means for driving said oscillator means responsive to a modulating signal applied individually to each of said two oscillator means in opposite phases respectively, first means for mixing the output signals of said oscillator means for delivering a frequency modulated signal centered around a frequency corresponding to said predetermined frequency value, each of said oscillator means being a quadripole ASW (acoustic surface wave) oscillator having a feedback branch extending from an output transducer to an input transducer, said feedback branch including a conventional amplifier means and a voltage controlled variable phase shifter, two input terminals on each of said voltage controlled variable phase shifters, one of said input terminals being connected to receive said modulating signal and the other of said input terminals being connected to receive a feedback from said output transducer of said ASW oscillator, means including microwave links for transmitting said frequency division telephone multiplex signals through said system, wherein said frequency corresponding to said predetermined value is an intermediate frequency and wherein the modulating signal is said frequency-division telephone multiplex signals transmitted over said microwave links, and second means for mixing the output of said first mixing means with a locally generated signal.

6. A transmission system including two oscillator means having center frequencies separated by a predetermined frequency value, means for driving said oscillator means responsive to a modulating signal applied individually to each of said two oscillator means in opposite phases respectively, first means for mixing output signals of said oscillator means for delivering a frequency modulated signal centered around a frequency corresponding to said predetermined frequency value, each of said oscillator means being a quadripole ASW (acoustic surface wave) oscillator having a feedback branch extending from an output transducer to an input transducer, said feedback branch including a conventional amplifier means and a voltage controlled variable phase shifter, two input terminals on each of said voltage controlled variable phase shifters, one of said input terminals being connected to receive said modulating signal and the other of said input terminals being connected to receive a feedback signal from the output transducer of said ASW oscillator, means for applying said modulating signal to one terminal of a primary winding of a transformer, the other terminal of said primary winding being grounded, said driving means being end terminals of a secondary winding of said transformer connected to said input terminals of said voltage controlled variable phase shifters in said two oscillator means, a middle point of said secondary winding being grounded, means including microwave links for transmitting microwave signals throughout said system, said predetermined frequency corresponds to an intermediate frequency and the modulating signal being a frequency-division telephone multiplex signal transmitted over said microwave links, and means for mixing the output of said first mixing means with locally generated signals.

7. A transmission system using microwave links for transmitting signals through said system, said signals having a service channel for transmitting service channel signal outside of the frequency band of the frequency-division telephone multiplex signals transmitted over said microwave links, said system including a frequency modulator comprising two quadripole acoustic surface wave oscillator means each having an input transducer and an output transducer, said two oscillators oscillating about individually associated center frequencies, the center frequencies of said two oscillator means being separated by a predetermined frequency value corresponding to the frequency of a local primary source oscillator, means for supplying said two oscillator means with service channel signals in an opposite phase relationship, first means for mixing the output signals of said two oscillator means and for delivering a frequency modulated output signal centered upon said predetermined frequency value, each of said oscillator means having a feedback means comprising an amplifier and a voltage controlled variable phase shifter means, and at least a pair of input terminals on said voltage controlled variable phase shifter means, one of said input terminals being connected to receive said service channel signals and the other of said input terminals being connected to receive a feedback from said output transducer of said acoustic surface wave oscillator means, and second means for mixing the output of said first mixing means with a locally generated primary source of signals.

8. A transmission system using microwave links for transmitting frequency division telephone multiplex signals through said system in a predetermined frequency band, said transmission system also having a service channel outside of said predetermined frequency band, local oscillator means providing a primary source of microwaves for said transmission system, said service channel means including a frequency modulator means comprising two quadripole acoustic surface wave oscillator means, each having an input transducer and an output transducer and oscillating about individually associated center frequencies, the center frequencies of said two oscillator means being separated by a predetermined frequency value corresponding to the frequency of said local oscillator means, means for supplying said two acoustic surface wave oscillator means with said service channel signals in opposite phase relationships, means for mixing the output signals of said two acoustical surface wave oscillator means and for delivering a frequency modulated output signal centered upon said predetermined frequency value, each of said two acoustical surface wave oscillator means having a feedback means comprising an amplifier and a voltage controlled variable phase shifter means, said voltage controlled variable phase shifter means having at least a pair of input terminals, one of said control input terminals being directly connected to receive said service channel signal and the other of said control input terminals being connected to receive a feedback from the output transducer of said acoustic surface wave oscillator, and second mixing means for mixing the output of said first mixing means and signals transmitted by said microwave links.

* * * * *